United States Patent [19]

Kim et al.

[11] Patent Number: 5,382,788
[45] Date of Patent: Jan. 17, 1995

[54] MONOLITHIC PHOTOCONDUCTIVE BIPOLAR PULSAR UTILIZING A RADIAL TRANSMISSION LINE

[75] Inventors: Anderson H. Kim, Toms River; Robert J. Youmans, Brick; Maurice Weiner, Ocean; Lawrence E. Kingsley, Shrewsbury, all of N.J.

[73] Assignee: The United States of America as represented by the Secretary of the Army, Washington, D.C.

[21] Appl. No.: 105,314

[22] Filed: Jul. 16, 1993

[51] Int. Cl.⁶ ............................................. H01J 40/14
[52] U.S. Cl. .................... 250/214.1; 257/448
[58] Field of Search .................... 250/214.1, 551; 257/448, 459

[56] References Cited

U.S. PATENT DOCUMENTS 4,593,306 6/1986 Marchant ............................. 257/448

FOREIGN PATENT DOCUMENTS 0385803 9/1990 European Pat. Off. ......... 250/214.1
1283882 11/1989 Japan ................................. 257/459

OTHER PUBLICATIONS

IBM Technical Disclosure Bulletin, Dec. 1964, vol. 7, No. 7 pp. 618–619.
"Monolithic, photoconductive impulse generator using a GaAs wafer," Applied Physics Letters 58 (24), Jun. 17.

Primary Examiner—David C. Nelms
Assistant Examiner—Tiep H. Nguyen
Attorney, Agent, or Firm—Michael Zelenka; James A. DiGiorgio

[57] ABSTRACT

A monolithic photoconductive pulsar utilizing a radial transmission line structure to store energy and a unique optical pulse illumination means to trigger the radial transmission line to radiate extremely, high voltage gain, narrow bipolar pulses. By achieving a higher voltage gain, the bipolar RF pulses are desirable in that they substantially improve the efficiency and lifetime of the device over the prior art.

1 Claim, 1 Drawing Sheet

MONOLITHIC PHOTOCONDUCTIVE BIPOLAR PULSAR UTILIZING A RADIAL TRANSMISSION LINE

GOVERNMENT INTEREST

The invention described herein may be manufactured, used, and licensed by or for the Government for governmental purposes without the payment to us of any royalty thereon.

FIELD OF THE INVENTION

The invention described herein is a device for generating a subnanosecond bipolar impulse of radio frequency energy using a monolithic photoconductive device. Potential applications are impulse radio, cellular phone, wireless PBX, and tactical communications equipment.

BACKGROUND OF THE INVENTION

Recently, considerable progress has been made in the generation of high power pulses for applications to wide-band impulse transmitters. For example, a pulsed laser beam has been used to render material at the end of a charged transmission line conductive so that it would immediately discharge and cause a traveling wave to flow through that end of the line to an antenna coupled to it. Such a transmission line structure acted as both an energy storage device and a switch.

Although coaxial and microstrip transmission lines have been used in this capacity in the past, the art has settled on using radial transmission lines structures. This is mainly due to the fact that the traveling waves converge at the center of such radial transmission line structures, and thus produce pulses of higher energy. Consequently, devices comprised of such structures require less charge to achieve the same output level as microstrip devices, and thus provide greater device efficiency and longer device life. These and other properties that make radial transmission line structures more desirable than other structures are described in an article entitled "Monolithic, photoconductive impulse generator using a GaAs wafer," authored by the present inventors was published in "Applied Physics Letters 58 (24)," on Jun. 17, 1991.

A monolithic photoconductive impulse generator utilizing such a radial transmission line structure was disclosed in the inventors copending application, Docket No. CECOM 4722, entitled "Pulse Sharpening Using An Optical pulse," and is incorporated herein by reference. This device utilizes an optical means to control the discharge of a radial transmission line structure having the properties described above to increase the radiated bandwidth well above one gigahertz.

Basically, the disclosed optical means comprises a laser beam that triggers both the discharge of the radial transmission storage structure and the termination of that discharge at some predetermined time later. The optical means further comprises a laser light source, a beam splitter, and two fiber cables having predetermined lengths which are different from each other. The beam splitter splits the beam emitted from the laser light source and directs the first beam into the first and shorter fiber cable, and the second beam into the second and longer fiber cable. For this reason, the second beam travels a longer optical path than the first beam such that a predetermined delay is created between the cable paths. The first beam is utilized to trigger the discharge of the radial transmission line, whereas the second beam is utilized to trigger the termination of the discharge. Consequently, the energy discharge profile is sharpened and the radiated pulse bandwidth is widened.

Although the above pulse sharpening device improves the overall efficiency and performance over the prior art, the device does not fully utilize the geometry of the radial transmission line structure, as described above. In particular, the device does not fully utilize the voltage gain nor does it fully provide the operating efficiency that such a structure is capable of providing. Consequently, those skilled in the art greatly desire such a device that fully utilizes the geometry of radial transmission line structures, and thus substantially improves the radiation bandwidth, voltage gain, operating efficiency, and operating lifetime of the device without substantially adding to its cost or size.

SUMMARY OF THE INVENTION

Accordingly, the general purpose of this invention is to provide an RF radiator that generates an impulse having a higher output voltage gain, extended bandwidth, and thus a substantial overall efficiency improvement and lifetime extension over the prior art.

In general, the present invention contemplates utilizing a unique optical pulse illumination means to trigger a radial transmission line impulse generator to radiate extremely narrow bipolar pulses. The bipolar pulses are desirable in that they substantially improve the voltage gain, and thus the efficiency and lifetime of the device over the prior art.

In a preferred embodiment, the monolithic radial transmission line generator comprises two concentric energy storage mediums which are basically cylinder-like transmission-line electrodes having a concentric circle at their center. The concentric gap between the inner and outer concentric electrodes comprise a first switch which when activated by a pulse of light triggers the discharge of the stored energy. The gap between the inner concentric electrode and the concentric circle comprise a second switch which isolates the electrodes from short circuit during their discharge cycle and which when activated triggers the termination of the discharging energy.

The optical pulse illumination means comprises a Galilean telescope beam expander and a toroidal lens. The Galilean beam expander consists of a divergent and a convergent lens positioned in series. The Galilean expander, in effect, takes a laser beam from a laser light source and upcollimates it along a predetermined optic axis. This upcollimated beam is then passed through the toroidal lens which behaves the same as a converging lens rotated about the predetermined optic axis. As such, the toroidal lens changes the upcollimated beam into an annulus of light centered around a center beam traveling along the optic axis.

The optical pulse illumination means is utilized to trigger the radial transmission line structure to radiate a high voltage gain bipolar pulse. First, the inner and outer concentric cylinders are pulse charged to $+V_o$ and $-V_o$, respectively. Second, the annulus of light is directed at the first switch to trigger the discharge of the stored energy. Third, the center beam is directed at the second switch to trigger the abrupt termination of the discharge. Finally, this switching action causes the device to radiate the desired high voltage gain, narrow, bipolar pulse in a perpendicular direction to the surface of the transmission line structure. Consequently, by controlling the delay between the time the annulus hits the first switch and the time the center beam hits the second switch, the bandwidth of the radiated bipolar pulse can be controlled.

BRIEF DESCRIPTION OF THE DRAWINGS

The sole FIGURE is a pictorial drawing of the preferred embodiment.

DETAILED DESCRIPTION

Figure 1:
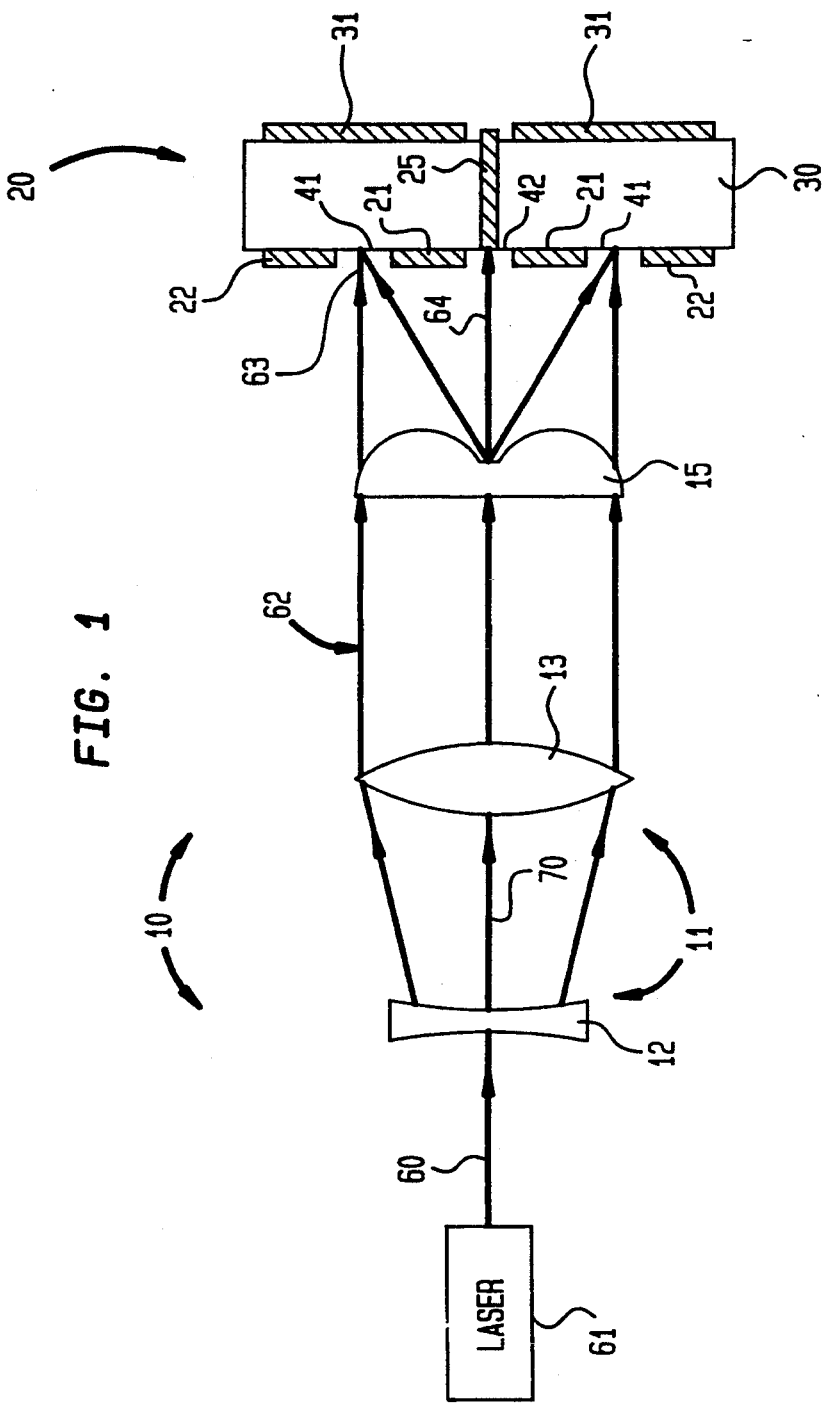

Referring now to the drawings, there is shown in the FIGURE optical pulse illuminator 10 optically coupled to monolithic radial transmission line generator 20 such that illuminator 10 can control the discharge of energy stored by generator 20, and thus control the formation of the radiated pulse.

The top surface monolithic radial transmission line generator 20 comprises two concentric electrodes 21 and 22 having concentric circle 25 at the center of inner electrode 21. Top electrodes 21 and 22 form concentric cylinder-like energy storage mediums with bottom electrode 31. The concentric gap between inner and outer electrodes 21 and 22 comprises a first photoconductive switch 41, whereas the gap between inner electrode 21 and concentric circle 25 comprises second photoconductive switch 42. Switch 42 isolates concentric circle 25 and the concentric storage mediums 21 and 22 from short circuit.

Accordingly, first light pulse 63 triggers switch 41 to instantaneously discharge energy stored by concentric energy storage mediums 21 and 22 through a predetermined load (not shown), whereas second light pulse 64 triggers switch 42 to instantaneously stop the discharge. Both first and second pulse 63 and 64 are generated by optical pulse illuminator 10. Illuminator 10 comprises Galilean telescope beam expander 11 and toroidal lens 15. Galilean beam expander 11 comprises divergent and convergent lens 12 and 13, respectively, positioned in series. Galilean expander 11, in effect, takes beam 60 from laser light source 61 and upcollimates it along predetermined optic axis 70. Upcollimated beam 62 is then passed through toroidal lens 15 which behaves as if it were a converging lens rotated about predetermined optic axis 70. As such, toroidal lens 15 reforms upcollimated beam 62 into annulus of light 63 centered around center beam 64 traveling parallel to optic axis 70.

Consequently, optical pulse illuminator 10 can be utilized to trigger radial transmission line generator 20 to radiate a high voltage gain bipolar pulse. First, inner and outer concentric storage mediums 21 and 22 are pulse charged to $+Vo$ and $-Vo$, respectively. Second, center beam 64 and annulus of light 63 are directed at switches 41 and 42 to trigger the discharge of the stored energy. This switching action causes the device to generate the desired high voltage gain, narrow, bipolar pulse in a perpendicular direction to the surface of transmission line generator 20.

Further, by controlling the delay between the time annulus of light 63 hits first switch 41 and the time center beam 64 hits second switch 42, the bandwidth of the radiated bipolar pulse can be controlled.

What is claimed is:

1. A photoconductive ultra-wideband impulse generating device, comprising:

a radial transmission line impulse generator comprising an outer and an inner cylindrical storage medium, said mediums are concentric to each other but separated by a first photoconductive gap, said mediums having a concentric circle positioned within said inner storage medium but separated from said inner medium by a second photoconductive gap, said first and second gaps comprising switches for triggering and terminating the discharge of said storage mediums, said inner and outer mediums charged to a predetermined $+Vo$ and $-Vo$, respectively; and an optical means for illuminating said first and second photoconductive gaps to trigger and terminate the discharge of said mediums such that a high voltage gain bipolar pulse is radiated from said impulse generator, said optical means comprising a galilean expander and a toroidal lens positioned in series with a laser beam such that an annulus of light is directed at said first gap to trigger said discharge and a center beam is directed at said second gap to terminate said discharge.

* * * * *